United States Patent [19]

Asada

[11] Patent Number: 5,457,420

[45] Date of Patent: Oct. 10, 1995

[54] INVERTER CIRCUIT AND LEVEL SHIFTER CIRCUIT FOR PROVIDING A HIGH VOLTAGE OUTPUT

[75] Inventor: Hideki Asada, Tokyo, Japan

[73] Assignee: NEC Corporation, Tokyo, Japan

[21] Appl. No.: 218,125

[22] Filed: Mar. 25, 1994

[30] Foreign Application Priority Data

Mar. 26, 1993 [JP] Japan .................................. 5-067258
May 6, 1993 [JP] Japan .................................. 5-105254

[51] Int. Cl.$^6$ ...................... H03K 17/687; H03K 19/003
[52] U.S. Cl. ........................ 327/437; 327/333; 327/328; 327/389; 327/391; 326/81
[58] Field of Search .................................. 327/333, 328, 327/327, 378, 389, 391, 374, 227, 228, 229, 205, 206, 437, 108; 326/62, 81; 365/189.11

[56] References Cited

U.S. PATENT DOCUMENTS

5,136,190  8/1992  Chern et al. ........................ 327/333
5,272,389 12/1993  Hatada .................................. 327/306
5,369,315 11/1994  Tran .................................... 326/82

FOREIGN PATENT DOCUMENTS

62-269419 11/1987  Japan .
63-105522  5/1988  Japan .

Primary Examiner—Timothy P. Callahan
Assistant Examiner—Terry L. Englund

[57] ABSTRACT

An inverter circuit for providing a high voltage output has an input terminal and an output terminal. The circuit further includes a first conductivity type first field effect transistor connected between a first power source line and the output terminal and having a gate electrode connected to the input terminal and second conductivity type second to (n+1)th field effect transistors connected in series between the output terminal and a ground line and having gate electrodes respectively connected to the input terminal. A voltage supply supplies (n−1) in number of second to (n)th power source voltages, whose absolute values become smaller in order, to a respective junction of the series connected second to (n+1)th transistors when the second to (n+1)th transistors are in OFF state.

12 Claims, 9 Drawing Sheets

($V_{dd1} > V_{dd2} > V_{dd3} \cdots > V_{ddn}$)

INVERTER CIRCUIT AND LEVEL SHIFTER CIRCUIT FOR PROVIDING A HIGH VOLTAGE OUTPUT

BACKGROUND OF THE INVENTION

The present invention relates generally to a transistor circuit. More specifically, the invention relates to a transistor circuit employing peripheral driver circuits, such as a liquid crystal display, a contact type image sensor, a liquid crystal shutter, a vacuum fluorescent display and so forth.

In the peripheral drivers, such liquid crystal display, contact type image sensor, liquid crystal shutter, vacuum fluorescent display and so forth, a technology for integrally fabricating the peripheral driver circuit and the display element thereof in order for reduction of size and cost and for attaining high reliability, has been widely employed. By fabricating the pixel electrode as electrode of the display element and the peripheral driver circuit on a common substrate, it becomes possible to significantly reduce number of terminals for mutual connection and number of external driver IC chips. Furthermore, it becomes possible to solve a problem in reliability which is limited due to limit of precision in a bonding process for large area and high density IC chips.

The peripheral driver circuit for these display elements, particularly for liquid crystal display element, normally includes shift register circuits, output buffer circuits and switches. Furthermore, in the shift register circuit, inverter circuits and switches are included. The output buffer circuit is formed by connecting inverter circuits in a cascade configration. The inverter circuit employed in such shift register circuit and the output buffer circuit is a basic component of the peripheral driver circuit.

Referring to FIG. 8, the conventional inverter circuit illustrated therein has an input terminal 100, an output terminal 200, a P-channel type gate insulated field effect transistor (P-type MOS transistor) 1 and N-channel type gate insulated field effect transistor (N-type MOS transistor) 2. The drain electrode of the P-type MOS transistor 1 which is connected to a power supply voltage Vdd at the source electrode, is commonly connected to the output terminal 200 and the drain electrode of the N-type MOS transistor 2. The source electrode of the N-type MOS transistor 2 is connected to a ground potential. Respective gate electrodes are commonly connected to the input terminal 100. As these MOS transistors, polycrystalline silicon thin film transistor (p-Si FET) is employed.

Again reference is made to FIG. 8, P-type MOS transistor 1 is designed such that an ON current flows from the source electrode to the drain electrode when the voltage supplied to the gate electrode becomes lower than Vdd-|Vtp| (Vtp: an absolute value of a threshold voltage of the P-type MOS transistor). N-type MOS transistor 2 is designed to initiate flow of ON current when the potential at the gate electrode becomes higher than the threshold voltage thereof. Accordingly, when the input signal is high (H), the transistor 1 becomes OFF state, the transistor 2 becomes ON state to supply low (L) level to the output terminal 200. On the other hand, when the input signal is low (L) level, the transistor 1 becomes ON state and the transistor 2 becomes OFF state to supply H level to the output terminal 200.

In the above-mentioned peripheral driver circuit integrated liquid crystal display, N-type MOS transistor for a switching element is arranged for each pixel. To the drain electrode of the N-type MOS transistor for switching element, an image signal line is connected to apply a 12 volt data signal. The data signal has to be transferred to a pixel electrode arranged at the side of the source electrode. Therefore, typically, a gate pulse having a pulse amplitude of approximately 20 volts (12 volts+ threshold voltage Vth of the N-type MOS transistor) is supplied to the gate electrode of the N-type MOS transistor. Namely, the peripheral driver circuit has to be driven by the power supply voltage of 20 volts.

Referring to FIG. 9, there are illustrated input and output waveforms when the conventional inverter circuit is driven by the power supply voltage of 20 volts, and source-drain voltage waveforms of the transistor 1 and the transistor 2. When the input voltage Vin is 20 volts, and thus the output voltage Vout is 0 volt, the source-drain voltage Vds1 of the transistor 1 is 20 volts as the transistor 1 is in OFF state and the source-drain voltage Vds2 of the transistors 2 is 0 volt as the transistor 2 is in ON state.

On the other hand, when the input voltage is 0 volt and thus the output voltage Vout is 20 volts, the source-drain voltage Vds2 is 20 volts. Accordingly, in order to attain stable operation of the peripheral driver circuit, the source-drain breakdown voltage is necessary higher than 20 volts.

On the other hand, associating with shortening channel length of the transistor, a generation of a hot carrier should creates a problem of degradation of the characteristics. The hot carrier degradation is substantial in the case of N-type MOS transistor. The hot carrier is caused by acceleration of the electron flowing from the source electrode to the drain electrode by a high electricfield at the edge of the drain electrode. The electron injected within a high field region in the vicinity of the drain electrode generates a large number of electron and hole through impact ionization. These hot carriers turn excessive drain current or are injected to the oxide layer. As a result, degradation of the source-drain breakdown voltage, increasing of the threshold voltage, lowering of a transconductance are caused.

In general, the hot carrier becomes a problem when a channel length is less than or equal to 2 μm in an IC chip of a monocrystalline silicon which is driven at 5 volt. However, as set forth above, in the peripheral driver circuit for the liquid crystal display, it is required to drive at 20 volts. Therefore, even in a channel length range (e.g. 4 μm) at which the hot carrier will not raise the problem at 5 volts, a hot carrier degradation will be caused.

As a solution for this, it is most effective to employ a structure for lowering field strength of the drain electrode, such as an offset gate structure or LDD (Lightly Doped Drain) structure. However, in case of the offset gate structure, it is not always an ideal structure in view of operation speed of the driver circuit for low ON current. On the other hand, in case of the LDD structure, process steps are increased to lower yield to cause rising of a cost.

On the other hand, in the peripheral driver circuit for the liquid crystal display, the contact-type image sensor or so forth, one of the most important circuit is a scanning circuit. The scanning circuit typically comprises a shift register and an output buffer circuit. In the recent years, a level shifter circuit for converting the output voltage level is often used as an interface circuit between shift register circuit and the output buffer circuit.

This is intended achieve low power consumption and high reliability by operating the shift register at high speed by a lower voltage than the driving voltage of the output buffer. Toward the future, the level shifter circuit will perform more important functions.

FIG. 10 is a circuit diagram showing a circuit including the conventional level shifter circuit and its peripheral circuit. The shown level shifter circuit is provided between the shift register circuit 20 and the output buffer circuit 30. The level shifter circuit comprises a level shifter portion 11 and an inverter portion 12.

The shift register circuit 20 is operated with a low power supply voltage Vdd2 and the maximum output voltage is Vdd2. The level shifter portion 11 operates with high power supply voltage Vdd1 and the maximum output voltage Vout is Vdd1.

In the level shifter portion 11, the input signal Vin supplied from the shift register circuit 20 is supplied to the gate electrode of the N-type MOS transistor 2. The drain output Va of the MOS transistor 2 is supplied to the gate electrode of the P-type MOS transistor 5. On the other hand, an inverted signal of the input signal Vin inverted by the inverter portion 12 is applied to the gate electrode of the N-type MOS transistor 6. The drain output of the N-type MOS transistor 6 becomes the circuit output Vout, and, as well, is applied to the gate electrode of the P-type MOS transistor 1.

The P-type MOS transistor 1 and the N-type MOS transistor 2 are connected in cascade configration between the supply voltage Vdd1 and the ground potential. Also, the P-type MOS transistor 5 and the N-type MOS transistor 6 are connected in cascade configration between the power supply voltage Vdd1 and the ground potential.

The inverter portion 12 operates with a power supply voltage Vdd2 and is a known circuit construction of cascade connection of a P-type MOS transistor 9 and a N-type MOS transistor 10. By this inverter portion 12, the input signal Vin is inverted to be the gate input for the transistor 6.

It should be noted that such construction of the level shifter circuit has been disclosed in Japanese Unexamined Patent Publications Nos. 62-269419 and 63-105522.

In this example, the power supply voltage Vdd2 for the shift register circuit 20 and the inverter portion 12 is set at substantially half of the power supply voltage Vdd1 for the level shifter portion 11. Accordingly, the maximum voltage levels of the input signal Vin and its inverted signal become half of Vdd1. FIG. 11 shows voltage waveforms at respective portion of the level shifter portion 11. When the input signal Vin is low level (0 V), the transistor 2 becomes OFF and the transistor 6 becomes ON. Therefore, the potential at the gate electrode of the transistor 1 falls to the ground potential to turn the transistor 1 ON. By turning ON of the transistor 1, the power supply voltage Vdd1 is supplied to the gate electrode of the transistor 5 to turn the latter OFF. As a result of this, the output signal Vout becomes 0 V of the low level.

On the other hand, when the input signal Vin becomes high level, the transistors 2, 5 become ON and the transistors 6, 1 become OFF. Thus, the output signal Vout becomes high level, i.e. Vdd1. Thus, the input signal Vin of the maximum voltage Vdd2 is converted into the output signal Vout of the maximum voltage Vdd1.

For instance, in case of the liquid crystal display, a video signal Vv having an amplitude of 12 V is transmitted to the source electrode of a MOS transistor 41 for each pixel of a liquid crystal display portion 40 composed of a liquid crystal cell 42 and N-type MOS transistor 41. In order to efficiently transmit this video signal Vv to the liquid crystal cell 42, the gate voltage of the transistor 41 is set at approximately 20 V which is higher than the video signal Vv in the extent of the threshold voltage of the transistor 41.

Namely, the voltage for driving the gate electrode of the transistor 41 for the liquid crystal display portion 40 in response to the output signal Vout of the level shifter portion 11, namely the maximum voltage of the output signal Vout of the level shifter portion 11 is set at approximately 20 V. Therefore, the power source voltage Vdd1 is also set at approximately 20 V.

Here, when the input signal Vin is a low level, the source-drain voltage Vds2 of the transistor 2 becomes substantially equal to the power supply voltage Vdd1. On the other hand, when the input signal Vin is a high level, the source-drain voltage Vds6 of the MOS transistor 6 becomes substantially equal to the power supply voltage Vdd1. Therefore, it becomes necessary to set the source-drain breakdown voltages of the transistors 2 and 6 higher than the power source voltage Vdd1 (20 V).

Accordingly, even with this level shifter circuit, the similar problem that is arisen by the inverter circuit of FIG. 8 is inherently caused.

SUMMARY OF THE INVENTION

Therefore, it is an object of the present invention to provide an inverter circuit which can provide high voltage output and high reliability without causing lowering of the operation speed and increasing of the process steps.

Another object of the present invention is to provide a level shifter circuit which can provide high voltage output and high reliability without causing lowering of the operation speed and increasing of the process steps.

According to a first aspect of the invention, a transistor circuit comprises:

an input terminal;

an output terminal;

a first conductivity type first field effect transistor connected between a first power source terminal and the output terminal and having a gate electrode connected to the input terminal;

second conductivity type second to (n+1)th field effect transistors connected in series between the output terminal and a ground terminal and having gate electrodes respectively connected to the input terminal; and potential supply means supplying (n−1) in number of second to (n) th power source voltages, whose absolute values become smaller in order, to respective junction of series connected second to (n+1)th transistors when the second to (n+1)th transistors are in OFF state.

According to a second aspect of the invention, a transistor circuit comprises:

an input terminal;

an output terminal;

a first conductivity type first field effect transistor connected between a first power source terminal and the output terminal and having a gate electrode connected to the input terminal;

second conductivity type second and third field effect transistors mutually connected in series between the output terminal and a ground terminal and having respective gate electrodes connected to the input terminal; and first conductivity type fourth field effect transistor connected between a second power source terminal having smaller absolute value of power source voltage than that of the first power source voltage and a junction of the series connected second and third field effect transistors, and having a gate electrode connected to the input terminal.

According to a third aspect of the invention, a transistor circuit comprises:

an input terminal;

an output terminal;

a first conductive type first field effect transistor connected between a first power source terminal and a first node and having a gate electrode connected to the output terminal;

second conductivity type second and third field effect transistors mutually connected in series between the first node and a ground terminal and having respective gate electrodes connected to the input terminal;

first conductivity type fourth field effect transistor connected between a second power source terminal having smaller absolute value of power source voltage than that of the first power source voltage and a junction of the series connected second and third field effect transistors, and having a gate electrode connected to the input terminal;

first conductivity type fifth field effect transistor connected between the first power source terminal and the output terminal and having a gate electrode connected to the first node;

second conductivity type sixth and seventh field effect transistors connected in series between the output terminal and the ground terminal, respectively having gate electrodes, to which the inverted signal of the input signal is applied; and a first conductivity type eighth field effect transistor connected between the second power potential and the junction between series connected sixth and seventh field effect transistors and having a gate electrode connected thereto the inverted signal.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiments of the present invention will be discussed hereinafter in detail with reference to the accompanying drawings.

Figure 1:
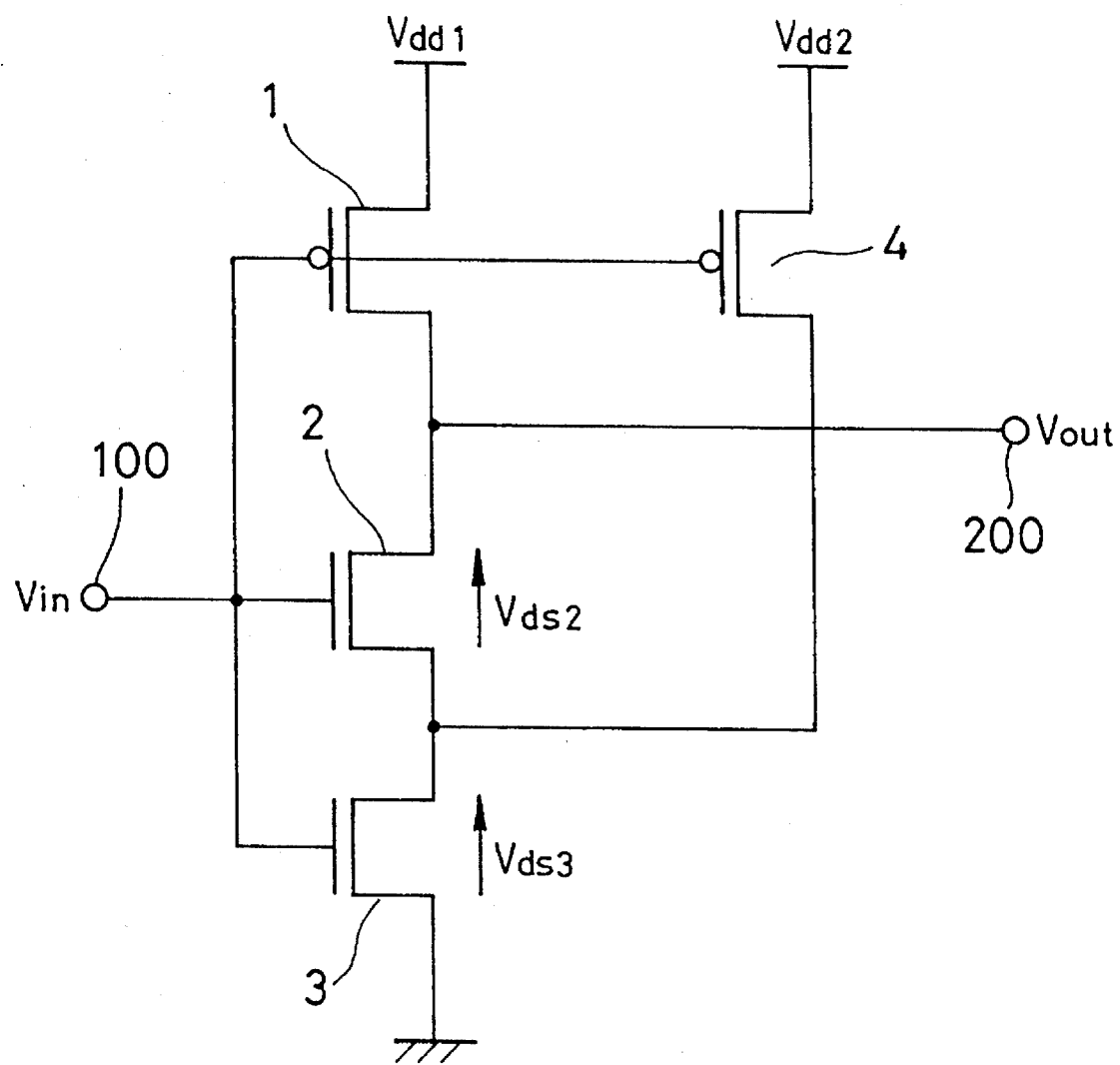
FIG. 1 is a circuit diagram showing one embodiment of an inverter circuit according to the present invention.
Figure 8:
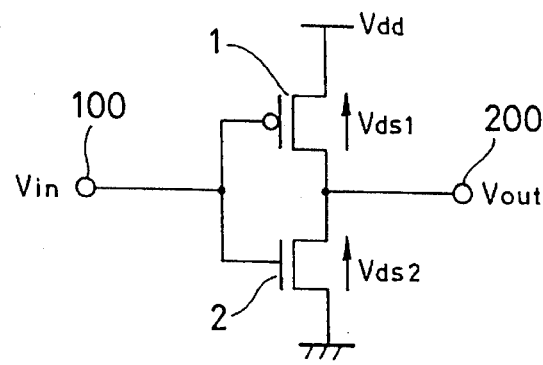
FIG. 8 is a circuit diagram showing a conventional inverter circuit.
Figure 9:
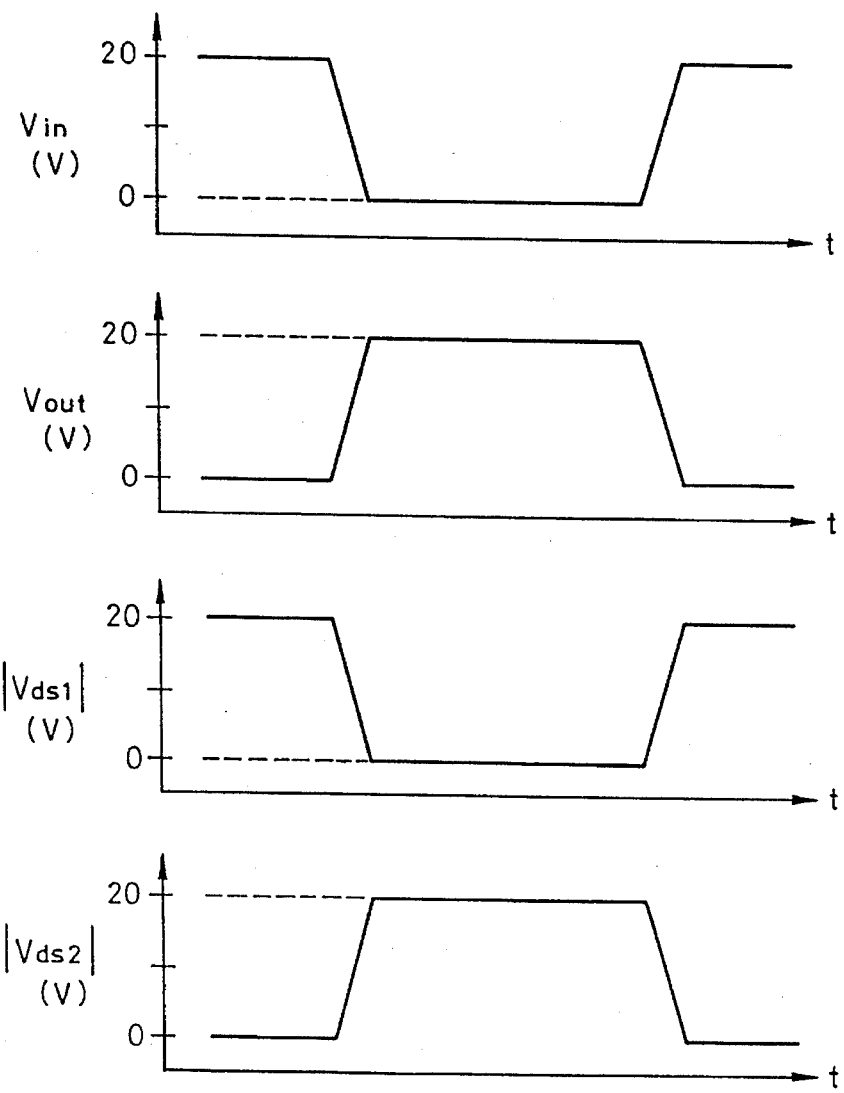
FIG. 9 is a chart showing waveforms at various portion of the conventional inverter circuit of FIG. 8.

FIG. 1 is a circuit diagram showing one embodiment of an inverter circuit according to the present invention. In the following description, the like elements to those in FIG. 8 will be represented by like reference numerals. Referring to FIG. 1, the P-type MOS transistor 1 is provided between the first power source line Vdd1 and the output terminal 200. To the gate electrode of the P-type MOS transistor 1, the input signal Vin at the input terminal 100 is applied.

Between the output terminal 200 and the ground line, N-type MOS transistors 2 and 3 are connected in series in this order. To the gate electrodes of these transistors 2 and 3, the input signal Vin is applied. On the other hand, between the second power source line Vdd2 and the junction of the series connected transistors 2 and 3, the P-type MOS transistor 4 is provided. To the gate electrode of the transistor 4, the input signal Vin is applied.

Here, when the second power source potential $Vdd_2$ is substantially half of the first power source potential Vdd1, the source-drain breakdown voltages BVds2 and BVds3 of the transistors 2 and 3 can be limited to be substantially half of the power source voltage Vdd1 when the input signal Vin is 0 volt.

Namely, when the voltage of the input signal Vin is 0 volt, the transistor 1 is turned ON. Then, the output voltage becomes Vdd1. When the power source voltage to be supplied to the transistor 4 is ½ Vdd1, the transistor 4 becomes ON state at 0 volt of the input voltage. Then, ½ Vdd1 of the voltage is supplied to the source electrode of the transistor 2 via the transistor 4. Since the drain electrode of the transistor 2 is connected to the output terminal 200, the source-drain voltage Vds2 of the transistor 2 becomes:

$$Vdd1-(½)\cdot Vdd1=(½)\cdot Vdd1$$

On the other hand, since the source electrode of the transistor 3 is connected to the ground line and the drain electrode thereof is commonly connected to the source electrode of the transistor 2, the source-drain voltage of the transistor 3 becomes $$(½)\cdot Vdd1-0=(½)\cdot Vdd_1$$

As set forth above, the source-drain voltage of the N-type MOS transistors 2 and 3 can be limited to be half of the driving voltage Vdd1 even when the input voltage is 0. Accordingly, even if the source-drain breakdown voltage of the N-type MOS transistor becomes lower than the driving voltage by shortening of the channel length, degradation of the characteristics due to generation of the hot carrier will never been caused. Thus, it is permitted to improve the breakdown voltage of the circuit with maintaining capability of high speed operation.

Next, the operation of the shown embodiment of the present invention will be discussed with reference to FIG. 2 in addition to FIG. 1. The shown embodiment of the inverter circuit which is fabricated by forming p-Si TFT on a glass substrate, is responsive to the pulse signal of H level having a voltage amplitude Vdd1 to turn the transistors 1 and 4 OFF state. On the other hand, the transistors 2 and 3 turn ON state so that L level pulse signal as inverted signal of the input pulse signal, is output at the output terminal 200 (Vin and Vout of FIG. 2)

Figure 2:
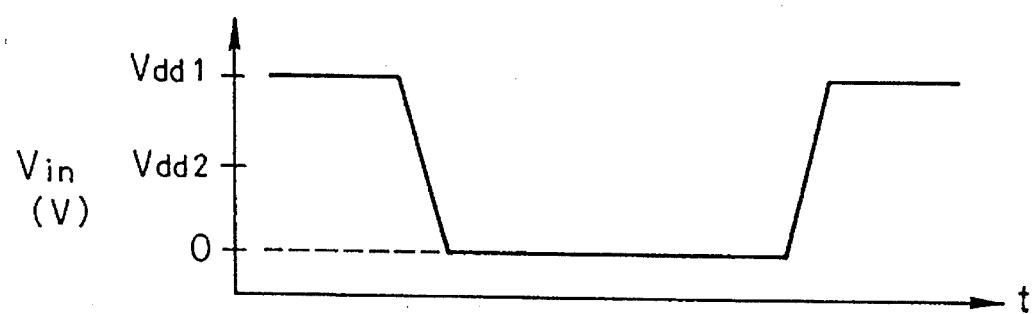
FIG. 2 is a chart showing waveforms at various portion of the inverter circuit of FIG. 1.
Figure 2:
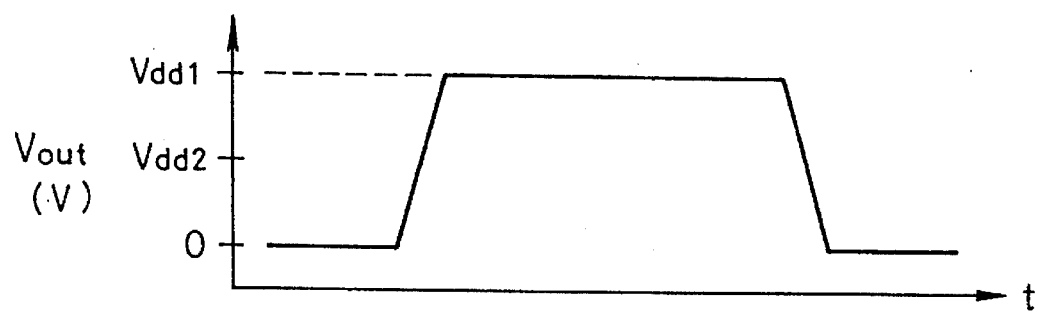
Figure 2:
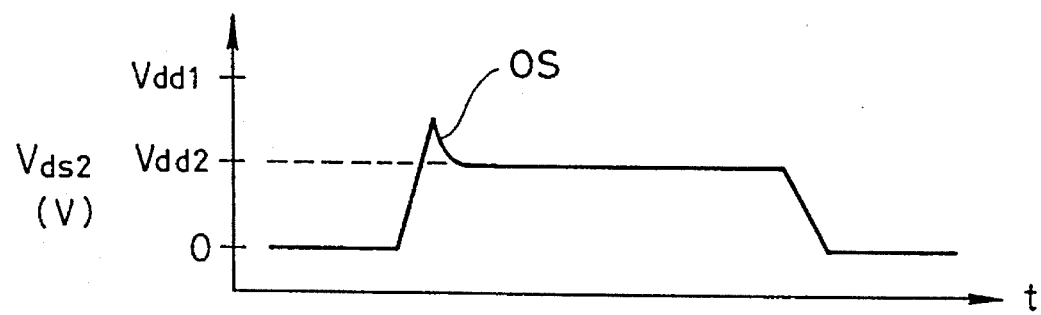
Figure 2:
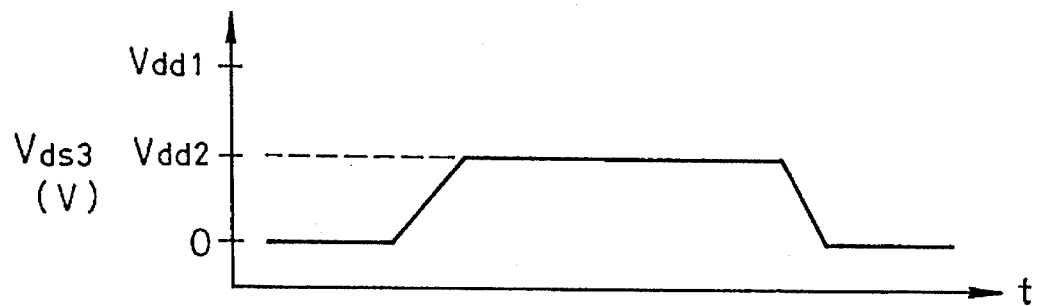

When the input voltage Vin is 0 volt, the transistors 1 and 4 becomes On state and the transistors 2 and 3 becomes OFF state so that H level pulse signal as the inverted signal of the input pulse signal is output from the output terminal 200 (Vin and Vout of FIG. 2).

On the other hand, at the transition from H level down to L level of the input voltage Vin, the transistors 2 and 3 are turned into OFF state, while the voltage at the drain electrode of the transistors 1 is risen to the power source voltage Vdd1. Therefore, the source-drain voltage Vds3 of the transistor 3 is varied from 0 volt to ($\frac{1}{2}$)Vdd1 volts.

This is because that by turning into ON state of the transistor 4, the drain electrode of the transistor 3 which is connected to the drain electrode of the transistor 4 is forcibly biased at ($\frac{1}{2}$)Vdd1. On the other hand, the source-drain voltage Vds2 of the transistor 2 is switched from 0 volt to ($\frac{1}{2}$)Vdd1 in response to variation of the input signal Vin from H level to L level, similarly to the source-drain voltage Vds3 of the transistor 3. During the transition to vary the source-drain is a voltage Vds2 from 0 volt to ($\frac{1}{2}$)Vdd1, there state where the source-drain voltage $Vds_2$ exceeds the ($\frac{1}{2}$)Vdd1. This depends upon the operation speed of the transistor 4.

Namely, when the sizes Wp/Lp (Wp: channel width, Lp: channel length) of the transistors 1 and 4 are designed to be equal to each other, if the operation speeds of the transistors 1 and 4 are compared, the operation speed of the MOS transistor 4 whose driving voltage is ($\frac{1}{2}$)Vdd1 is lower than that of the transistor 1. As a result of this, the rising period of the source-drain voltage Vds3 of the transistor 3 becomes longer than the rising period to H level of the output voltage Vout. Due to difference of the rising period, the source-drain voltage Vds2 becomes a waveform including an overshooting OS. This overshooting portion OS can be suppressed by optimizing the size of the transistor 4.

Figure 3:
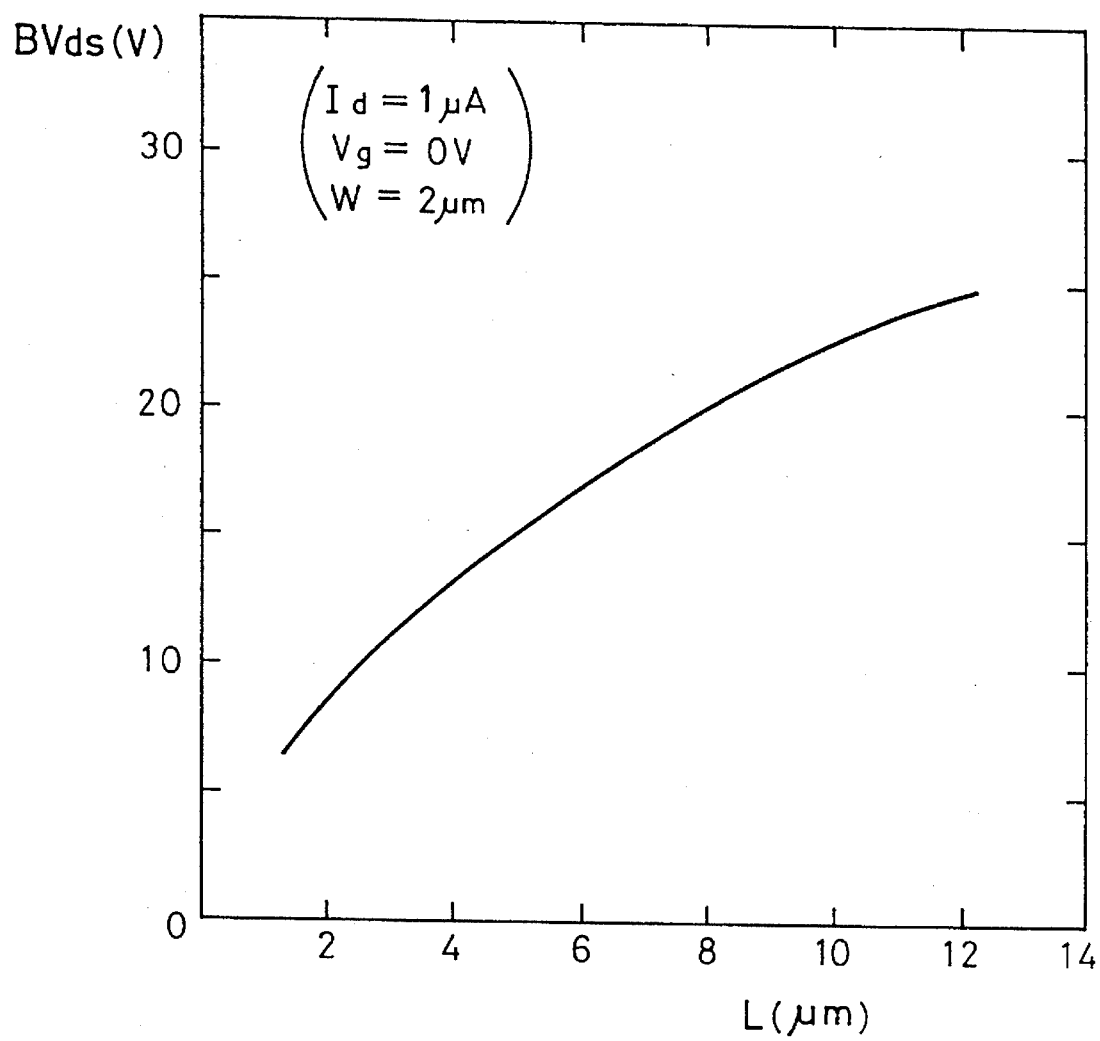
FIG. 3 is a chart showing a channel length dependency of a source-drain breakdown voltage BVds of an N-type MOS transistor.

Next, reference is made to FIG. 3, in which is illustrated the channel length dependency of the source-drain breakdown voltage BVds of the N-type MOS transistor fabricated according to the shown embodiment. The source-drain breakdown voltage BVds is defined to have 1 μA of a drain current Id at the gate voltage of 0 volt. From the characteristic curve illustrated in FIG. 3, the channel lengths of the N-type MOS transistors 2 and 3 were determined. Namely, when the driving voltage Vdd1 was 20 volts, the breakdown voltage BVds required for the N-type MOS transistors in the shown embodiment of the inverter circuit was higher than 10 volts. Therefore, the channel length Ln was set at 3 μm for satisfying the condition. On the other hand, the channel lengths Lp of the P-type MOS transistors 1 and 4 were designed to be 2 μm.

As a result of production of a vertical scanning circuit for a liquid crystal display employing the shown embodiment of the inverter circuit, no degradation of the operation speed even under continuous operation test through 1500 minutes at a condition of a clock frequency=1 MHz and a power supply voltage Vdd1=20 V.

In the embodiment of FIG. 1, two N-type MOS transistors 2 and 3 connected in series are disposed between the output terminal 200 and the ground line and the source-drain voltage of each transistor 2 and 3 is set at ($\frac{1}{2}$)·Vdd1. On the other hand, in the construction illustrated in FIG. 4, n in number of N-type MOS transistors 2·1 to 2·n (n is an integer greater than or equal to 2) connected in series are disposed between the output terminal 200 and the ground line. To (n−1) in number of junctions between series connected transistors, (n−1) in number of P-type MOS transistors 4·1 to 4·n−1 are provided for supplying second to nth power source line. To the gate electrodes of these transistors 4·1 to 4·n−1, the input terminal 100 is connected.

Assuming that the relationship between the first to nth power source potentials is:

Vdd1>Vdd2>Vdd3>→Vddn it is clear that the source-drain voltages of the N-type MOS transistors 2·1 to 2·n can be suppressed at (1/n)Vdd1.

Figure 5:
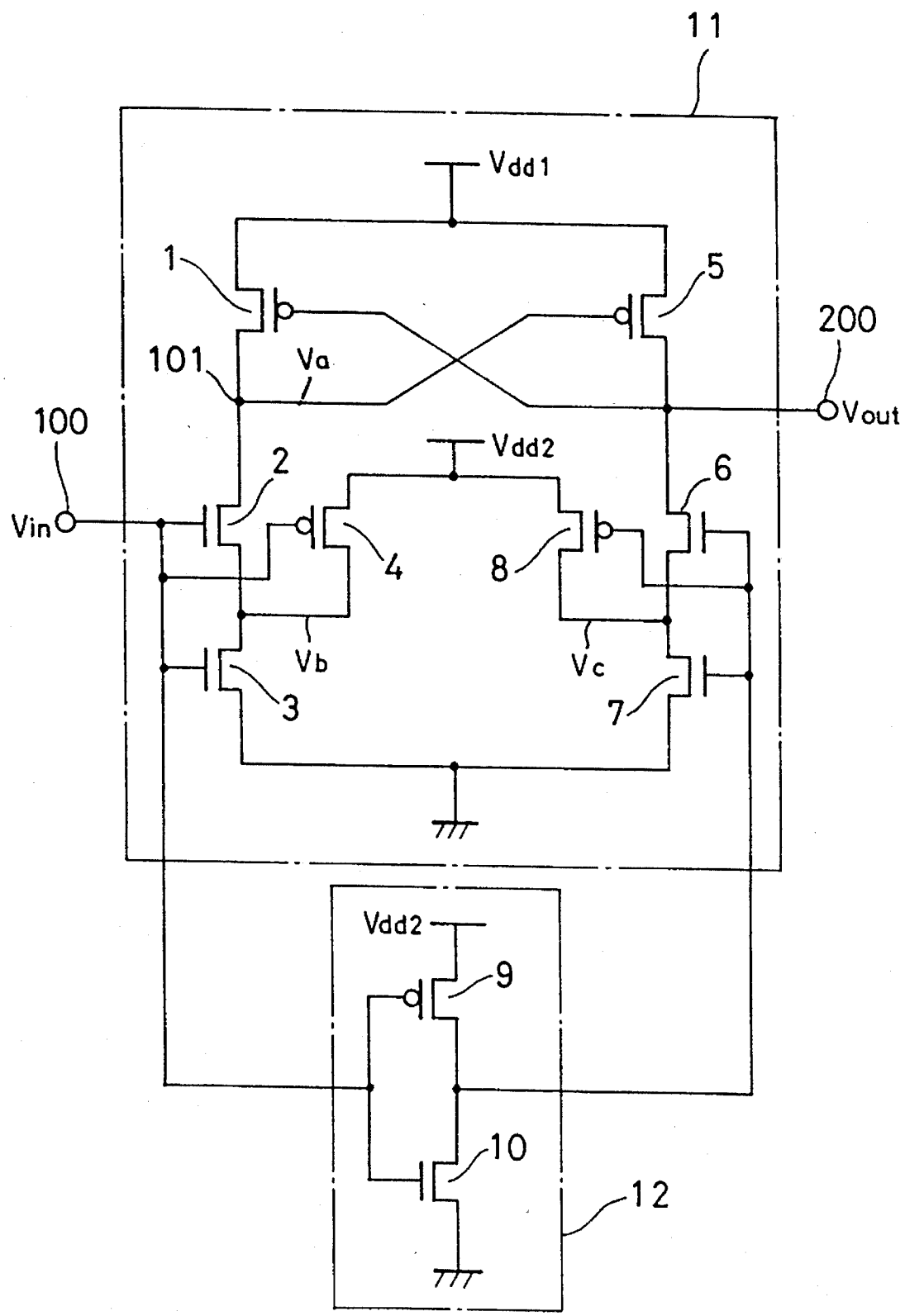
FIG. 5 is an illustration showing a level shifter circuit according to the present invention.
Figure 10:
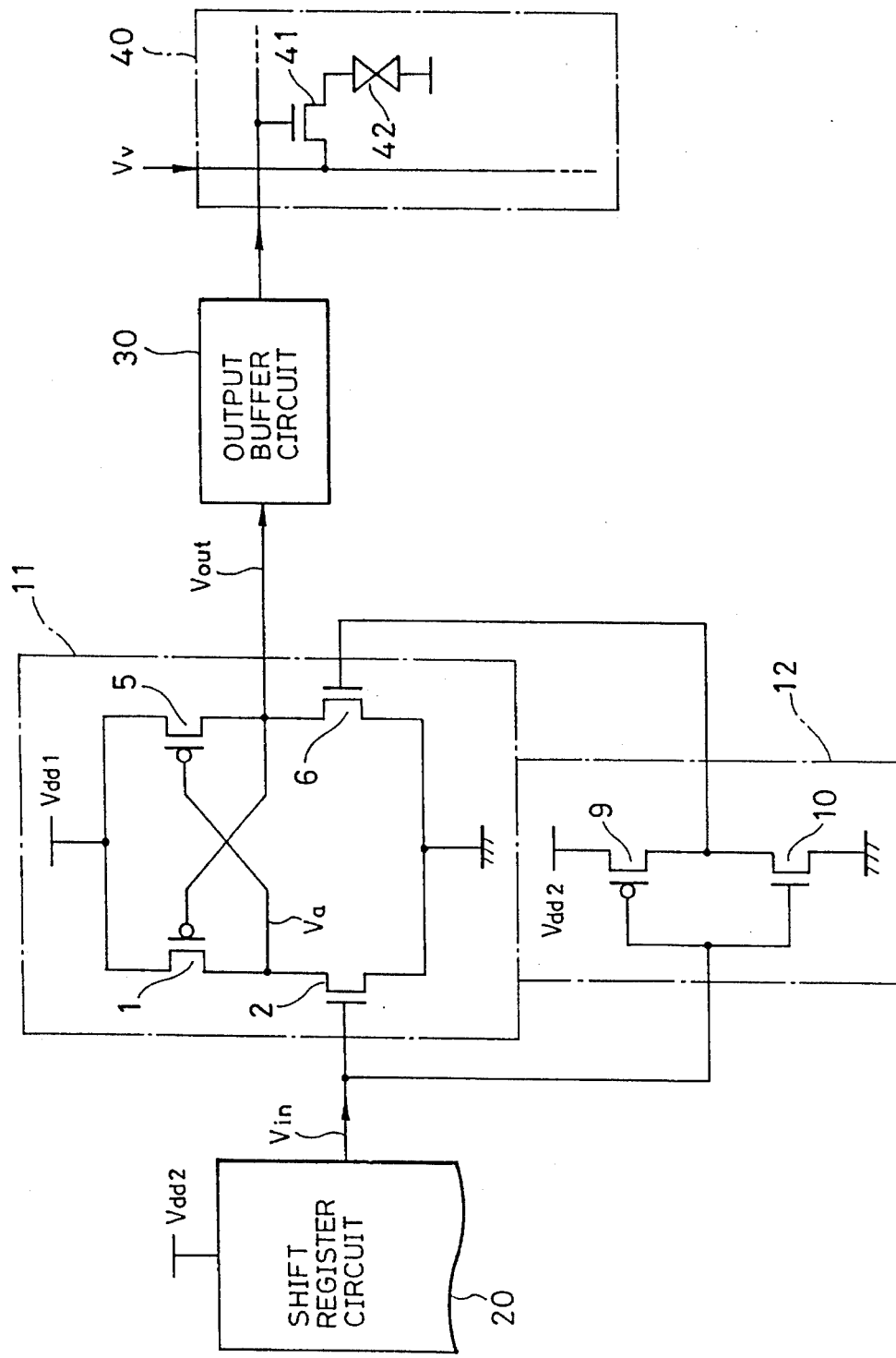
FIG. 10 is a circuit diagram showing the conventional level shifter circuit and its peripheral circuit.
Figure 11:
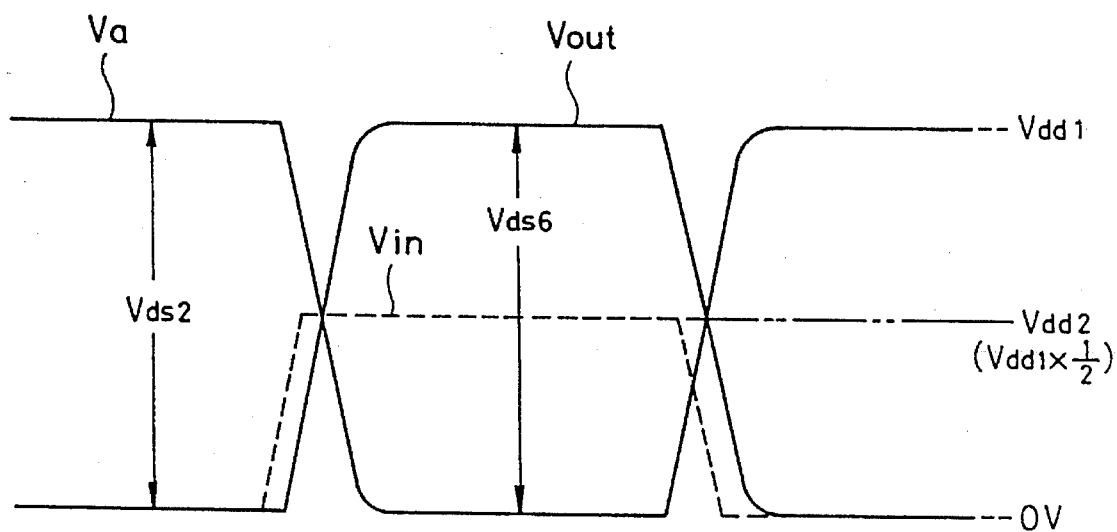
FIG. 11 is a chart showing waveforms at various portion of the level shifter circuit of FIG. 10.

FIG. 5 is a circuit diagram showing one embodiment of a level shifter circuit according to the present invention. In the shown embodiment, the like elements to those of FIG. 10 will be represented by the like reference numerals. Referring to FIG. 5, the P-type MOS transistor 1 is provided between the first power source Vdd1 and a node 101. The P-type MOS transistor 5 is provided between the power source Vdd1 and the output terminal 200. The gate electrode of the transistor 1 is connected to the output terminal 200. On the other hand, to the gate electrode of the transistor 5, the voltage Va of the node 101 is input.

Between the node 101 and the ground line, the N-type MOS transistors 2 and 3 are connected in series in this order. To the gate electrodes of the transistors 2 and 3, the input signal Vin of the input terminal 100 is applied. On the other hand, between the output terminal 200 and the ground line, N-type MOS transistors 6 and 7 are connected in series in this order. To the gate electrode of the transistors 6 and 7, the inverted signal of the input signal Vin inverted by the inverter 12 is applied.

Between the second power source potential $Vdd_2$ and the junction between the series connected transistors 2 and 3, the P-type MOS transistor 4 is provided. On the other hand, to the junction between the series connected transistors 6 and 7, a P-type MOS transistor 8 is provided. To the gate electrode of the transistor 4, the input signal Vin is applied. On the other hand, to the gate electrode of the transistor 8, the inverted signal of the input signal Vin is applied.

The inverter portion 12 is a known CMOS inverter circuit comprising a P-type MOS transistor 9 and a N-type MOS transistor 10. The CMOS inverter circuit as the inverter portion 12 is operated at the second power source voltage Vdd2.

Even in this embodiment, the second power source potential Vdd2 is set substantially half of the first power source potential Vdd1.

Figure 6:
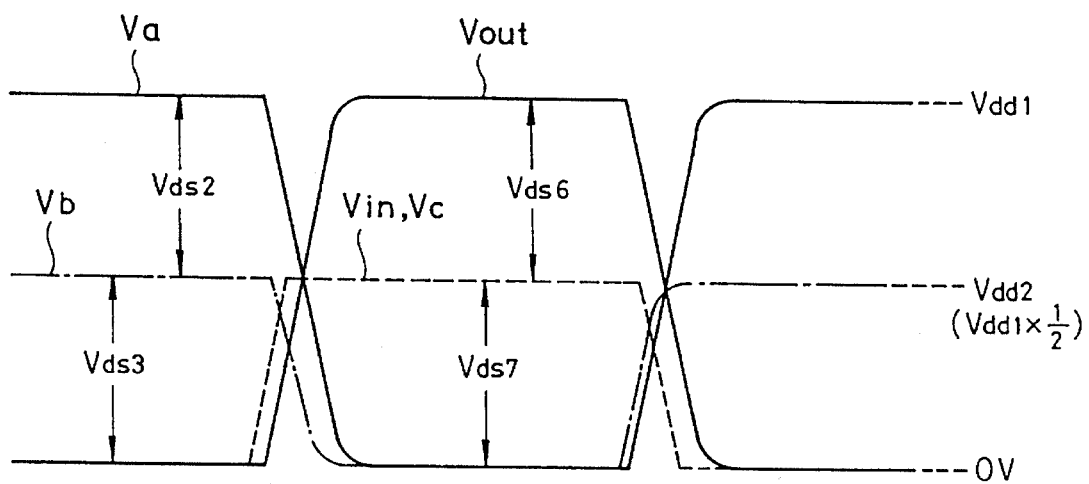
FIG. 6 is a chart showing waveforms at various portion of the level shifter circuit of FIG. 5.

FIG. 6 is a chart showing voltage waveforms at various portion of the circuit of FIG. 5 for showing the operations thereof. At first, when the input signal Vin is L level, the transistors 2 and 3 are in OFF state, the transistor 4 is in ON state, the transistors 6 and 7 are in ON state and the transistor 8 is in OFF state. Accordingly, the output Vout becomes 0 volt. At this time, both of the source-drain voltage Vds6 and Vds7 of the transistors 6 and 7 become 0 volt.

On the other hand, the voltage Vb at the drain electrode of the N-type MOS transistor 3 becomes Vdd2, and the voltage Va at the drain electrode of the transistor 2 becomes Vdd1. Therefore, both of the source-drain voltage Vds2 and Vds3 of the transistors 2 and 3 become half of the power source potential Vdd1 (equal to the power source potential Vdd2).

On the other hand, when the input signal Vin is H level, ON state and OFF state of respective transistors becomes opposite to that of the L level of the input signal. Then, the output signal Vout becomes the power source voltage Vdd1, the source-drain voltages Vds2 and Vds3 of the transistors 2 and 3 become 0 volt, and the source-drain voltages Vds6 and Vds7 of the transistors 6 and 7 become half of the power source potential Vdd1 (equal to the power source voltage Vdd2). Therefore, it becomes unnecessary to make the MOS transistors to be high voltage type.

Figure 7:
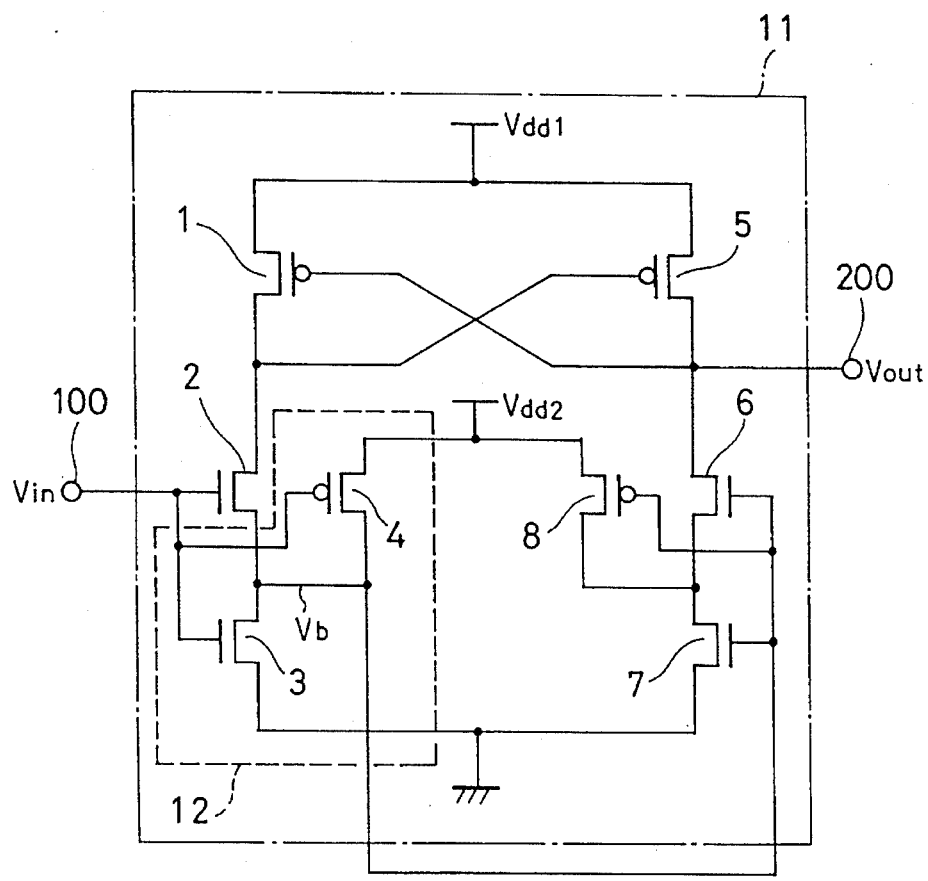
FIG. 7 is a circuit diagram showing another embodiment of a level shifter circuit according to the present invention.

FIG. 7 is a circuit diagram showing the second embodiment of the present invention. In the first embodiment shown in FIG. 5, the inverter portion 12 is provided separately from the level shifter portion 11 in order to obtain the level inverted signal of the input signal Vin. However, a circuit comprising MOS transistors 3 and 4 and performing the same function to the inverter portion 12 is present within the level shifter portion 11. Therefore, in the shown embodiment, the level inverted signal of the input signal Vin is obtained from the junction of the drain electrodes of the transistors 3 and 4 and supplied to the gate electrodes of the transistors 6 to 8 so that the inverter portion 12 in the first embodiment is not required. Since the operation and effect of the shown embodiment is the same as those of the first embodiment, the discussion therefor is neglected in order to avoid redundant discussion and keep the disclosure simple enough for facilitating understanding of the invention.

The level shifter circuit of the present invention as set forth above was fabricated by forming p-Si TFT on a glass substrate. Then, employing the level shifter circuit in the vertical scanning circuit of the liquid crystal display, a test was performed. The channel length of the thin film transistor forming the level shifter circuit was designed so that the breakdown voltage becomes 10 volts which is half of the power source voltage Vdd1 (i.e. 20 volts). Namely, the channel length of the N-type thin film transistor was set at 3 μm, and the channel length of the P-type thin film transistor was set at 2 μm. These channel lengths are equal to those of the thin film transistors operating at the driving voltage of 10 volts. With this circuit, no degradation of the operation speed even under continuous operation test through 1500 minutes at a clock frequency=1 MHz and a power source voltage Vdd1=20 V.

It should be noted that although the above-mentioned embodiments employs the second power source voltage Vdd2 being substantially half of the first power source voltage Vdd1, the level relationship should not be limited to the specific relationship but can be set any way as long as the second power source voltage is lower than the first power source voltage. Also, it is possible to alternate the P-type MOS transistors and the N-type MOS transistors. Namely, N-type MOS transistors can be employed in place of the P-type MOS transistors and P-type MOS transistors can be employed in place of the N-type MOS transistors. In such case, the polarity of the power source potential should be opposite to that illustrated. In this case, the absolute value of the second power source voltage must be larger than the absolute value of the first power source voltage.

Figure 4:
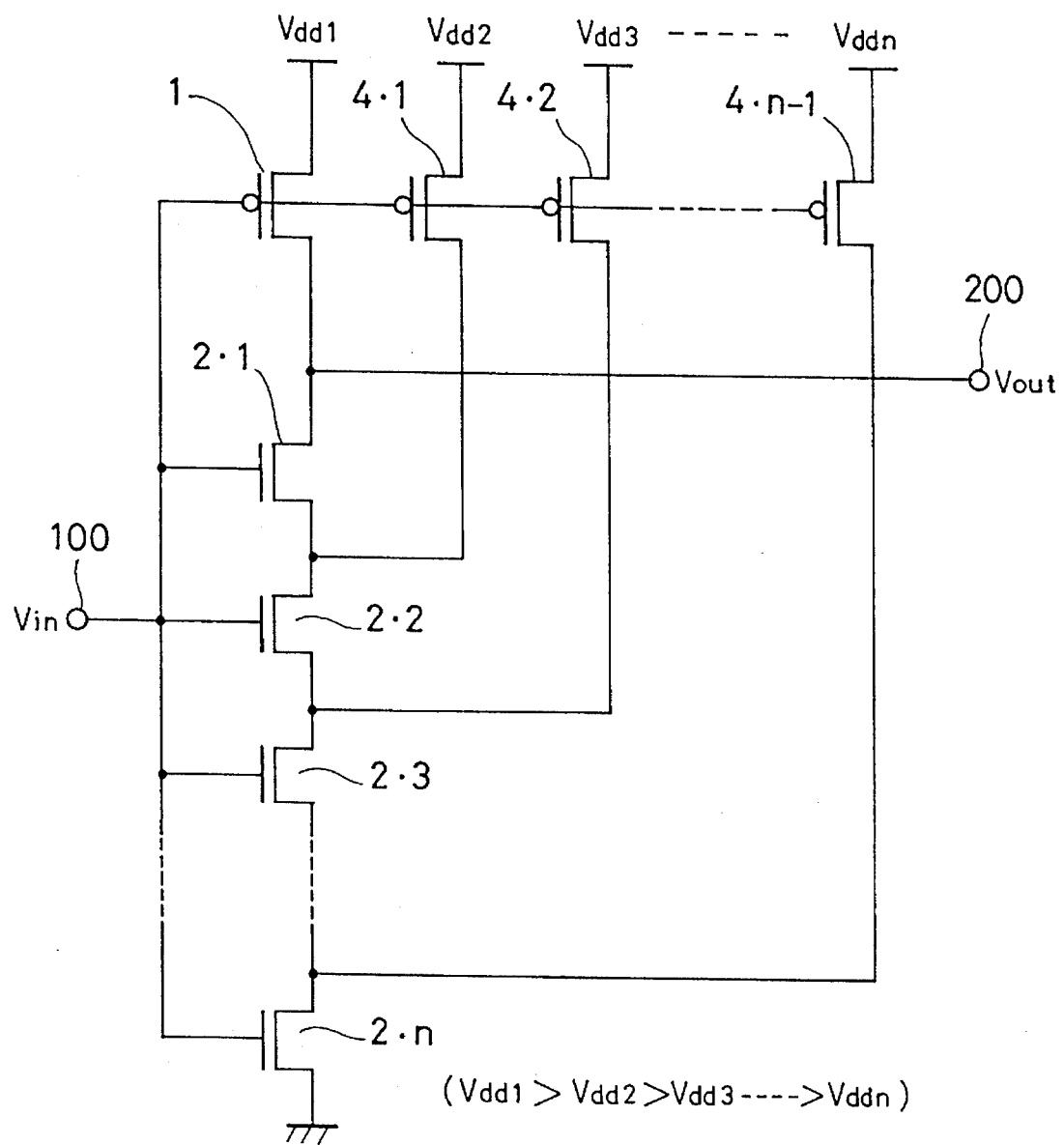
FIG. 4 a schematic circuit diagram showing a general construction of the inverter circuit according to the present invention.

Furthermore, although the ground potential is employed as a reference potential, the present invention should not be limited to the shown arrangement. In addition, it is clear that the construction in FIG. 4 is applicable for the level shifter circuit.

As set forth above, since the present invention employs n in number of N-type MOS transistors, for example, connected in series and is constructed to provide lower voltage than the operation power source voltage of the circuit when the transistors are in OFF state, the source-drain voltage of each transistor can be made lower. Therefore, the hot carrier degradations can be successfully prevented without causing increasing of the process steps and lowering of the operation speed. Also, the present invention can provide high voltage output and high reliability without causing degradation of characteristics.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A transistorized inverter circuit comprising:
   an input terminal;
   an output terminal;
   a first field effect transistor of a first conductivity type connected between a first power source line and said output terminal and having a gate electrode connected to said input terminal;
   second to (n+1)th field effect transistors of a second conductivity type connected in series between said output terminal and a reference voltage line and having gate electrodes respectively connected to said input terminal; and
   voltage supply means for supplying (n−1) in number of second to (n)th power source voltages, whose absolute values become smaller in order, to respective junction of series connected second to (n+1)th transistors when the second to (n+1) th transistors are in OFF state.

2. The circuit as set forth in claim 1, where in said voltage supply means comprises (n−1) in number of field effect transistors of the first conductive type respectively supply corresponding power source voltages for respective of (n−1) in number of junctions of series connected (n−1) in number of second to (n+1)th transistors.

3. The circuit as set forth in claim 2, wherein said first and second conductivity types are P and N-channel, respectively.

4. A transistorized inverter circuit comprising:
   an input terminal;
   an output terminal;
   a first field effect transistor of a first conductivity type connected between a first power source line and said output terminal and having a gate electrode connected to said input terminal;
   second and third field effect transistors of a second conductivity type mutually connected in series between said output terminal and a reference voltage line and having respective gate electrodes connected to said input terminal; and
   a fourth field effect transistor of the first conductivity type connected between a second power source line having smaller absolute value of a power source voltage than that of said first power source line and a junction of the series connected second and third field effect transistors, and having a gate electrode connected to said input terminal.

5. The circuit as set forth in claim 4, wherein said first conductivity type is P-channel type and said second conductivity type is N-channel type.

6. The circuit as set forth in claim 5, wherein said power source voltage of said second power source line is substantially half said power source voltage of said first power source line.

7. A transistorized inverter circuit comprising:
   an input terminal;
   an output terminal;
   a first field effect transistor of a first conductivity type connected between a first power source line and a first node and having a gate electrode connected to said input terminal;
   second and third field effect transistors of a second conductivity type mutually connected in series between said first node and a reference voltage line and having respective gate electrodes connected to said input terminal;
   a fourth field effect transistor of the first conductivity type connected between a second power source line having smaller absolute value of a power source voltage than that of said first power source line and a junction of the series connected second and third field effect transistors, and having a gate electrode connected to said input terminal;
   a fifth field effect transistor of said first conductivity type connected between said first power source line and said output terminal and having a gate electrode connected to said first node;
   sixth and seventh field effect transistors of said second conductivity type connected in series between said output terminal and said reference voltage line, and respectively having gate electrodes, to which an inverted signal of an input signal is applied; and
   an eighth field effect transistor of said first conductivity type connected between said second power source line and a junction between series connected sixth and seventh field effect transistors and having a gate electrode connected to receive said inverted signal.

8. The circuit as set forth in claim 7, wherein said input signal has two voltage levels, one of which is a level having smaller absolute value than a voltage level of said first power source line and a voltage level of said reference voltage line;

and an output signal of said output terminal has two levels of a voltage level of said first power source line and a voltage level of said reference voltage line.

9. The circuit as set forth in claim 7, which further comprises an inverter circuit generating said inverted signal of said input signal.

10. The circuit as set forth in claim 8, wherein said inverted signal is extracted from a junction between the series connected second and third field effect transistors.

11. The circuit as set forth in claim 7, wherein said first conductivity type is P-channel type and said second conductivity type is N-channel type.

12. The circuit as set forth in claim 11, wherein said power source voltage of said second power source line is substantially half a power source voltage of said first power source line.

* * * * *